United States Patent
Zinco et al.

(10) Patent No.: US 8,990,752 B2
(45) Date of Patent: Mar. 24, 2015

(54) METHOD FOR AUTOMATIC DESIGN OF AN ELECTRONIC CIRCUIT, CORRESPONDING SYSTEM, AND COMPUTER PROGRAM PRODUCT

(71) Applicant: STMicroelectronics S.r.l., Agrate Brianza (IT)

(72) Inventors: Giancarlo Zinco, Broni (IT); Mattia Monetti, Malnate (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/108,462

(22) Filed: Dec. 17, 2013

(65) Prior Publication Data

US 2014/0173542 A1      Jun. 19, 2014

(30) Foreign Application Priority Data

Dec. 18, 2012   (IT) .............................. TO2012A1102

(51) Int. Cl.
*G06F 17/50*   (2006.01)

(52) U.S. Cl.
CPC ........ *G06F 17/5081* (2013.01); *G06F 17/5072* (2013.01); *G06F 17/5018* (2013.01); *G06F 17/5036* (2013.01)
USPC .......................................... 716/115; 716/139

(58) Field of Classification Search
None
See application file for complete search history.

(56) References Cited

U.S. PATENT DOCUMENTS

| | | | |
|---|---|---|---|
| 2004/0187085 A1* | 9/2004 | Sinha et al. ........................ 716/4 |
| 2012/0254811 A1* | 10/2012 | Su et al. ............................ 716/52 |
| 2013/0007692 A1* | 1/2013 | Yeh et al. ......................... 716/136 |

OTHER PUBLICATIONS

IT Search Report and Written Opinion for IT TO2012A001102 mailed Aug. 22, 2013 (8 pages).
Chenggang Xu et al: "A Green Function-Based Parasitic Extraction Method for Inhomogeneous Substrate Layers," Design Automation Conference, 2005, Proceedings, 42nd Anaheim, CA, Jun. 13-17, 2005, pp. 141-146.
Kerns K J et al: "Stable and Efficient Reduction of Substrate Model Networks Using Congruence Transforms," Comptuer-Aided Design, 1997, Digest of Technical Papers, 1997 IEEE/AC M International Conference on San Jose, CA, Nov. 9-13, 1997, pp. 207-214.
Chan Henry: "Substrate Coupling Analysis and Noise Reduction Methods," Aug. 1, 2001, Montreal, Chapter 3—Substrate Modeling, 73 pages.
Verghese N K et al: "Fast Parasitic Extraction for Substrate Coupling in Mixed-Signal ICS," Proceedings of the Custom Integrated Circuits Conference, Santa Clara, May 1-4, 1995, pp. 121-124.

* cited by examiner

*Primary Examiner* — Leigh Garbowski
(74) *Attorney, Agent, or Firm* — Gardere Wynne Sewell LLP

(57) ABSTRACT

A method for automatic design of an electronic circuit, includes: generating (100) a layout (L) of the aforesaid electronic circuit; generating (200) abstract data (A) at the substrate level associated to the layout (L) of the aforesaid electronic circuit; generating (300) a grid (TG) of subdivision into meshes and nodes with respect to a view pertaining to the aforesaid abstract (A) and applying it to the aforesaid substrate (SBS); and extracting (400), on the basis of the aforesaid subdivision grid (TG), a full electrical netlist (NC) pertaining to the substrate (SBS). The method further includes performing an evaluation (500, 600) of the interactions between devices (DV) of the electronic circuit at the substrate level according to the aforesaid full electrical netlist (NC) pertaining to the substrate (SBS).

21 Claims, 14 Drawing Sheets

METHOD FOR AUTOMATIC DESIGN OF AN ELECTRONIC CIRCUIT, CORRESPONDING SYSTEM, AND COMPUTER PROGRAM PRODUCT

PRIORITY CLAIM

This application claims priority from Italian Application for Patent No. TO2012A001102 filed Dec. 18, 2012, the disclosure of which is incorporated by reference.

TECHNICAL FIELD

The present disclosure relates to techniques for automatic design of an electronic circuit.

In the present description, by "electronic circuit" is meant in general a single integrated circuit or systems of integrated circuits, to be produced using technologies for manufacturing on-chip integrated circuits that define a substrate for manufacturing the circuit.

Various embodiments can find application in processing apparatuses, such as workstations, server computers, and the like.

BACKGROUND

Substrate-design tools are known that operate in the environment of design of systems and electronic circuits, namely, EDA (Electronic Design Automation) environments. In particular, among EDA environments there is known, for example, the Cadence design suite, which comprises, in a version thereof, a platform, referred to as "Virtuoso Platform", for full-custom design of integrated circuits, which comprises entry of the schematics, behavioral modeling (Verilog-AMS), circuit simulation, full-custom layout, steps of verification at the physical level, extraction of netlists. The aforesaid platform envisages some indications for analyzing the substrate contacts of the transistors, for example, in the QRC Extraction Cadence module for calculation of the parasitic effects in the chip.

The assisted electronic-design tools available hence provide a very limited support when the interactions are to be assessed between electronic devices of the above electronic systems and circuits in a chip at the level of the substrate of the chip itself.

SUMMARY

In the context outlined above, there is felt the need to evaluate the interactions between electronic devices of the above electronic systems and circuits in a chip at the level of the substrate of the chip itself, overcoming the drawbacks outlined previously.

The various embodiments disclosed herein meet the aforesaid need.

In an embodiment, a method for automatic design of an electronic circuit comprises: generating a layout of said electronic circuit; generating abstract data at the substrate level associated to the layout of said electronic circuit; generating a grid of subdivision into meshes and nodes with respect to a view pertaining to said abstract and applying it to a substrate; extracting, on the basis of said subdivision grid, a full electrical netlist pertaining to the substrate; and performing an evaluation of the interactions between devices of said electronic circuit at the substrate level according to said full electrical netlist pertaining to the substrate.

Various embodiments may refer also to a corresponding system of computers, as well as a computer program product that can be loaded into the memory of at least one computer and comprises portions of software code that can implement the steps of the method when the product is run on at least one computer. As used herein, reference to such a computer program product is understood as being equivalent to reference to a computer-readable means containing instructions for control of the processing system in order to co-ordinate implementation of the method according to the invention. Reference to "at least one computer" is of course understood to highlight the possibility of the present invention being implemented in modular and/or distributed form.

The claims form an integral part of the technical teaching provided herein in relation to the invention.

BRIEF DESCRIPTION OF THE DRAWINGS

Various embodiments will now be described, purely by way of non-limiting example, with reference to the annexed figures, wherein.

DETAILED DESCRIPTION OF THE DRAWINGS

Figure 1:
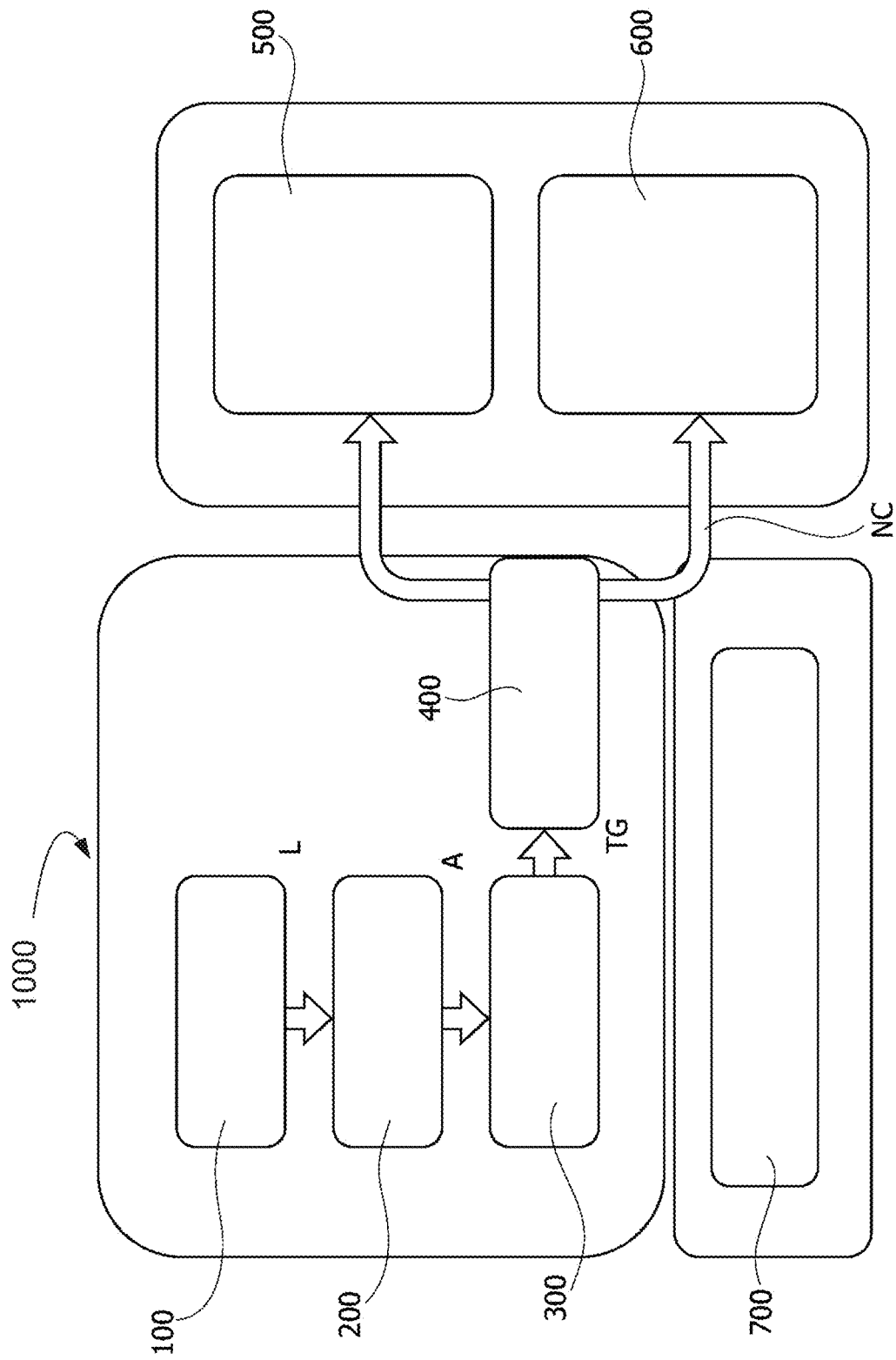
FIG. 1 is a principal flowchart diagram representing embodiments.

Illustrated in the ensuing description are various specific details aimed at providing an in-depth understanding of various examples of embodiment. The embodiments may be provided without one or more of the specific details, or with other methods, components, materials, etc. In other cases, known structures, materials or operations are not illustrated or described in detail so that the various aspects of the embodiments will not be obscured. Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may present in various points of the present description do not necessarily refer to one and the same embodiment. Moreover, particular conformations, structures, or characteristics may be combined in any adequate way in one or more embodiments.

The references used herein are provided merely for convenience of the reader and hence do not define the sphere of protection or the scope of the embodiments.

Embodiments relate to a method for automatic design of electronic systems and circuits.

According to one aspect, the above method comprises generating a layout of said electronic circuit, generating abstract data at the substrate level associated to the layout of said electronic circuit, generating a subdivision grid on the abstract view applied to said substrate, and extracting, on the basis of the aforesaid subdivision grid, a full electrical netlist pertaining to the substrate, and performing an evaluation of the interactions between devices of said electronic circuit at the substrate level according to said full electrical netlist pertaining to the substrate.

The aforesaid netlist is provided in one embodiment as a netlist of a flat type for an instance-based simulator, in particular a flat SPICE netlist, so as to be compatible with different simulators and fast SPICE simulators.

By "netlist" is here meant a description of the connectivity of an electronic design, in particular of the electronic design of an electronic circuit.

By "flat netlist" is meant a netlist of a flat design, where only the primitive instances are instantiated. Possible hierarchical designs are exploded in a recursive way, creating new copies of each definition whenever it is used. For this reason, flat netlists tend to create netlist databases that are much larger.

According to a further aspect, a procedure is provided for automating the connections between the aforesaid substrate netlist and the circuits.

According to a further aspect, it is envisaged to subdivide the set of the devices of the electronic circuit into a plurality of layers, separate each layer into different regions according to the technological parameters of the region, and apply a subdivision grid to each region of each layer.

According to a further aspect, it is envisaged to apply a subdivision grid via application of a Delaunay triangular grid.

According to a further aspect, the method envisages operating according to a mode that extracts the resistances of the substrate in a distributed way.

According to a further aspect, the method envisages operating according to at least three different modes:

a first mode, which extracts the resistances of the substrate in a distributed way, a second mode, which extracts the resistances of the substrate in a distributed way and extracts values of resistance and capacitance associated to the presence of well structures, in particular n-well structures, in a lumped way, i.e., in a discrete way or with concentrated-parameter analysis;

a third mode, which extracts the resistances of the substrate and the values of resistance and capacitance associated to the presence of n-well structures according to a three-dimensional finite-element analysis.

According to a further aspect, the method comprises setting boundaries for generation of the meshes of the grid that can be selected from different criteria.

According to a further aspect, the method operates in a multi-simulator environment so that the need to use mixed simulation tools is avoided.

According to a further aspect, the method operates in a multistructured environment that enables Direct Power Injection analysis.

FIG. 1 illustrates a general diagram of the method according to an embodiment.

Designated by 100 is an operation of definition of the database of the layout up to the substrate level via a layout-design software tool, in particular using, for example, the EDA Cadence platform, Virtuoso Platform. In other words, using a tool for design of devices and circuits a layout of the electronic circuit is generated and the data that define the aforesaid layout are stored in a database. In this context, a multilayer-approach description procedure 1000 is used, described hereinafter with reference to FIG. 2.

Starting from the above database of the layout, from which a layout view L is generated, in a step 200 generation of abstracts A and refinement of the abstract data generated is performed. The method envisages in one embodiment obtaining the abstract A generated via an operation of simplification of the view of the layout at the substrate level. This simplification envisages, for example, representing only the wells, or sockets, of an n type, with or without buried layers, and the sockets of p+ surface layers, and/or DTI (Deep Trench Isolation) sockets.

Reference is made herein, by way of example, as described in greater detail with reference to FIG. 2, to BCD (Bipolar-CMOS-DMOS) processes, where each device is insulated from the substrate through a junction insulation. The aforesaid insulation is obtained by inserting the device in purposely provided sockets of an n type, called "n-well sockets".

The abstracts are in any case created starting from the detailed layout in the database of the abstracts, i.e., the elements for the so-called abstract view of the elements (cells) defined in the layout, which comprise summary information such as name of the cell, orientation, names of the pins and other information. Operation of an abstract generator starting from the layout is in itself known to the person skilled in the sector. It should be noted that the method in the embodiment described herein is integrated with the Cadence environment in so far as it is possible to launch the corresponding program without leaving the aforesaid environment; moreover, for processing of the layout, the method or program is based on the Cadence database.

In a step 300, there is hence carried out generation of a subdivision grid TG with respect to the abstract A and possibly refinement of the aforesaid grid TG. The procedure for generation of the grid TG is performed, for example, through execution of an external software module, for instance, the 'Triangle' software (freely available from Carnegie Mellon University. The method according to the invention and the corresponding computer program product are configured for running the aforesaid software module automatically and in a way transparent to the user.

In a step 400, there is then performed generation of a full netlist NC of the substrate.

The above full substrate netlist NC is supplied to a netlist-simulation environment 500 incorporated in the method and system as further service.

The above full substrate netlist NC is moreover supplied to as a DPI (Direct Power Injection) assisted simulation environment 600 incorporated in the method and system as further service.

Designated by the reference 700 is a module for displaying abstracts and schematics with cross references, that operates in connection with the layout view L, the abstract view A, and a view at the schematic level S, i.e., at the level of the circuit schematics.

Figure 2:
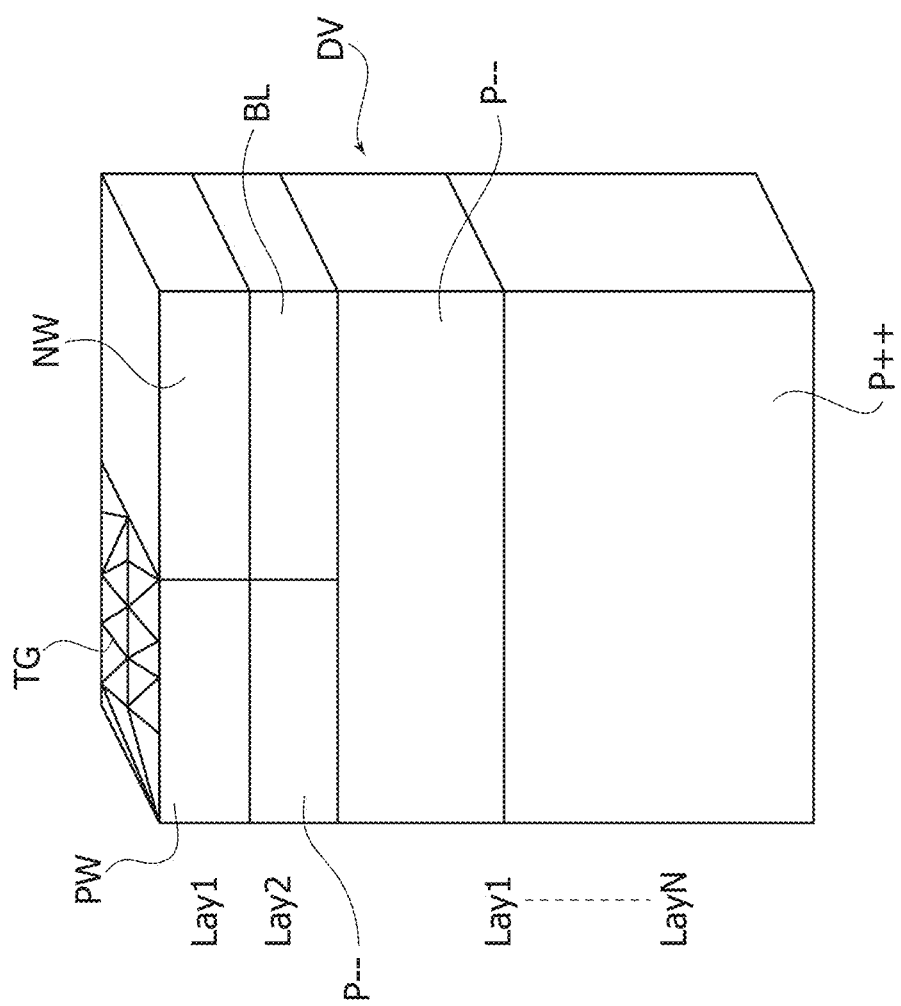
FIG. 2 is a schematic view of a device representing possible modalities of operation of embodiments.
Figure 8:
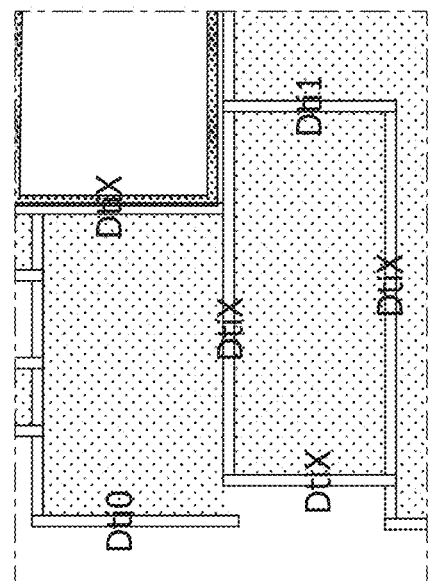
Figure 9:
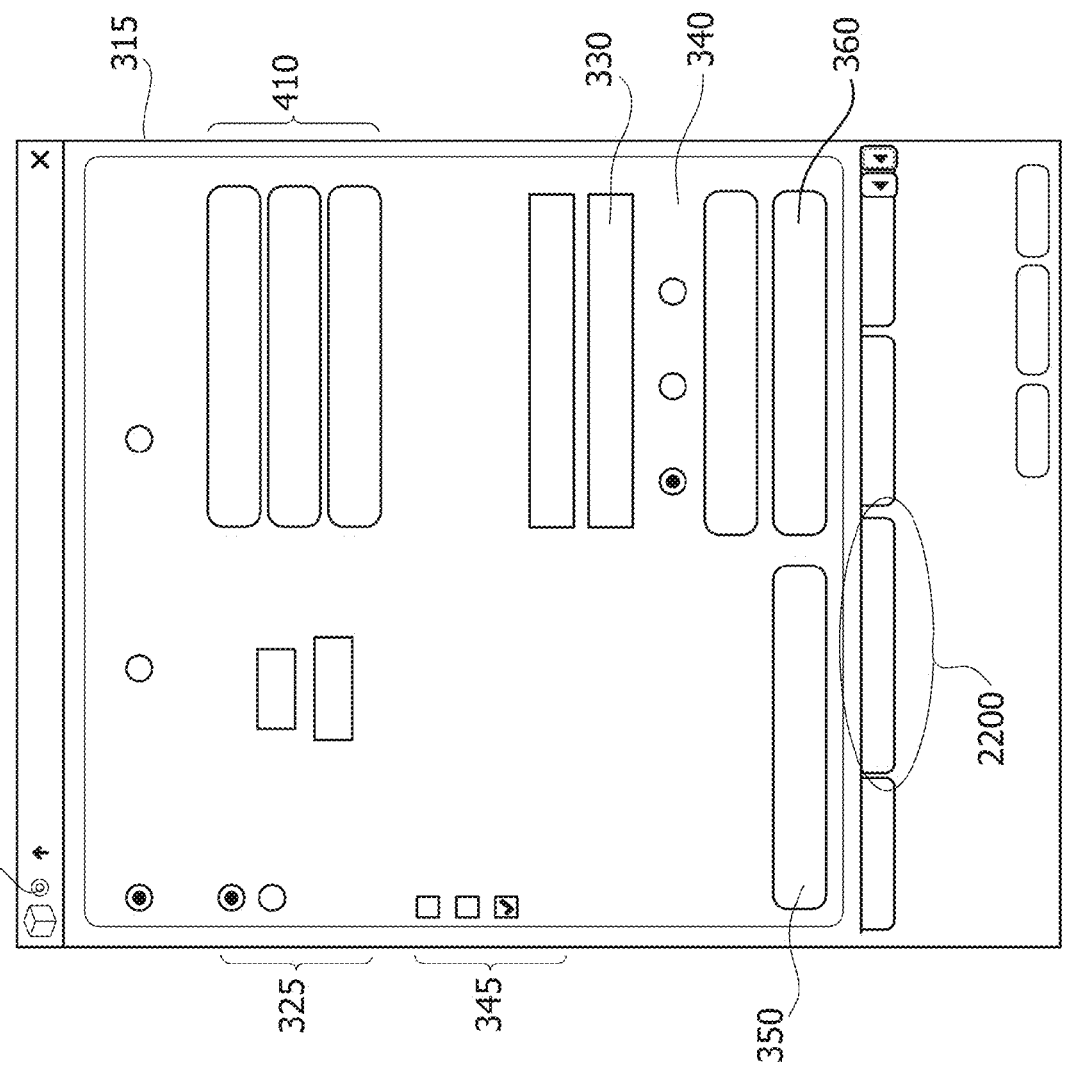

With reference to FIG. 2, there is now illustrated the procedure of description of the devices with a multilayer approach 1000 used by the method according to the invention in the step 100 of definition of the database of the layout at the substrate level. In this connection, FIG. 2 illustrates a section of a generic electronic integrated-circuit device provided with BCD (Bipolar-CMOS-DMOS) technology, designated by the reference DV. The aforesaid device DV according to the dictates of BCD technology comprises a p-well PW and an n-well NW, said wells being embedded in a p-- doped layer P--, usually an epitaxial layer. As envisaged by BCD technology, set underneath the n-well NW is a buried layer BL. Set underneath the p-- doped layer P--, is a heavily doped substrate layer P++, which is set at the bottom of the stack of layers. The procedure according to the description 1000 involves using a multilayer approach, which, with reference to the BCD device of FIG. 1, envisages:

subdividing the device or set of devices into a plurality of layers in a vertical direction, from a top layer $Lay_1$ to a bottom layer $Lay_N$; the aforesaid subdivision is usually made according to the layers identified by the manufacturing processes, for example, in BCD technology illustrated, the first layer $Lay_1$ is a layer of the wells (p-well PW and n-well NW); underneath there is a layer $Lay_2$ of the buried layers BL, then a third layer $Lay_3$, of just the layer P--, and at the bottom the substrate layer $Lay_N$ may be identified, i.e., the p++ substrate layer;

separating each i-th layer $Lay_i$ of the device DV (viewed in FIG. 2 in cross section) into different regions, which in a view at the abstract level, as discussed in what follows, for example, with reference to FIGS. 8 and 9, are also defined as "geometries", each associated to a different type of technological parameters that distinguish the aforesaid region, i.e., parameters that indicate, for example, whether it is a diffused region and with what kind of doping, namely, epitaxial or implanted; as has been said, shown in FIG. 2 are a p-well, an n-well, an epitaxial layer, a p++ doped substrate layer, and a buried layer (obtained, for example, by ion implantation and subsequent diffusion); it should be hence noted that in the second layer $Lay_2$ a specific lightly doped p-- region is identified, designated by P--, even though it forms part in actual fact of the same p-- epitaxial deposition of the third layer $Lay_3$.

The aforesaid description in layers enables, among other things, analysis of a p++ substrate layer that has different thicknesses and in any case bestows the flexibility of adding or removing process layers.

The aforesaid operations are, in one embodiment, completely automatic and are based upon the abstract view and upon the topological information contained in the abstract view itself. The data pertaining to each substrate portion are extracted by crossing the above topological information contained in the abstract with the process data contained in the technological files.

With reference to the operations of grid generation described in what follows, in FIG. 2 it is highlighted how it is envisaged to use, for each layer $Lay_1, \ldots, Lay_N$, one and the same partition grid TG traced on the top face of the top layer $Lay_1$, which is then applied to each layer $Lay_i$. The grid TG, as explained in detail in what follows, according to one aspect, is a Delaunay triangular partition grid.

The technological parameters contained in the technological files refer to the resistivity of the materials layer by layer and to the specific p/n junction capacitance. These data are extracted by a pre-processing of technological data referred to the (simulated or measured) diffusion profiles characteristic of each process.

Figure 3:
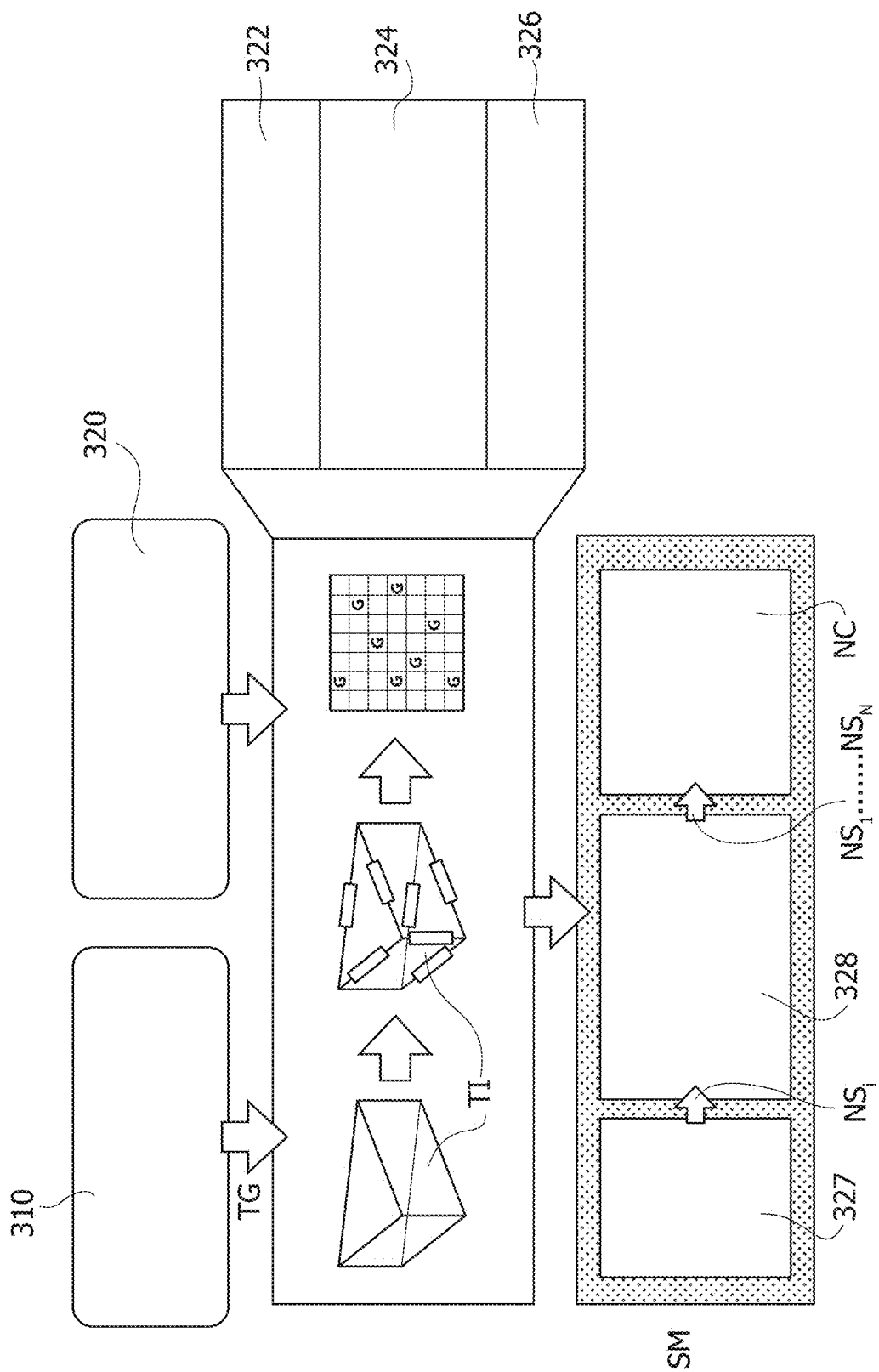
FIG. 3 is a schematic illustration of a step of embodiments.

Illustrated in greater detail in FIG. 3 is the process 300 of generation of the grid, which comprises, for each i-th layer $Lay_i$, a step 310 of generation of a Delaunay triangular grid TG. This step 310 determines identification of a plurality of triangular elements Tk in each respective layer $Lay_1, \ldots, Lay_N$ of a thickness corresponding to the thickness of the i-th layer $Lay_i$. It should be noted that the grid TG is single and is generated on the level of the abstract. Through a process of 'projection' the grid is replicated on each i-th layer $Lay_i$.

Then, in a step 322, each triangular element Tk of the i-th layer $Lay_i$ is analyzed for determining the dimensions thereof. A thickness and a type of material is attributed to each triangular element Tk according to its position in the abstract and the i-th layer $Lay_i$ to which it is associated. From this information there are extracted the values of conductance towards the contiguous triangular elements Tk, i.e., on the branches towards the corresponding nodes of the netlist, obtained by applying the triangular partition.

Hence, in a step 324, according to a technology-configuration file 320, which supplies information on the technological parameters of each layer and region, the elements of conductance G to be associated to the different dimensions of the triangular element Tk being analyzed are calculated. In a step 326, there is then built a representation of the i-th layer $Lay_i$ as sparse matrix SM of conductances. The sparse matrix SM is linked to the description of the resistive mesh, for example, via the so-called 'modified nodal method'. The value of each resistive element is calculated, for example, on the basis of the finite-element theory.

The above sparse matrix SM is passed to a sparse-matrix calculation engine 327, which converts the sparse matrix SM into a netlist $NS_i$ of the i-th layer $Lay_i$. This is accompanied by a step of creation of a file with the abstract information. On the basis of the netlists $NS_1, \ldots, NS_N$ corresponding to each layer $Lay_1, \ldots, Lay_N$ in a step 328 a full netlist of the substrate NC is then built, which indicates the connection of the electrical nodes to which the components are connected, for example, distributed resistances of the triangles Tk, modeled in step 324. An example of full substrate netlist NC is described hereinafter with reference to FIG. 14.

The above full substrate netlist NC, as has been said, is a flat netlist, which is advantageously simpler to instantiate, in so far as for this, for example, an 'include' command in the main SPICE netlist is sufficient. This type of description prevents the user from having to declare the points of access to the network, one for each abstract element. In terms of database structure, a description of a flat-netlist type does not imply any detriment from the standpoint of memory occupied during simulation as compared to a description of a subcircuit type because this type of netlist is instantiated only once.

Figure 4:
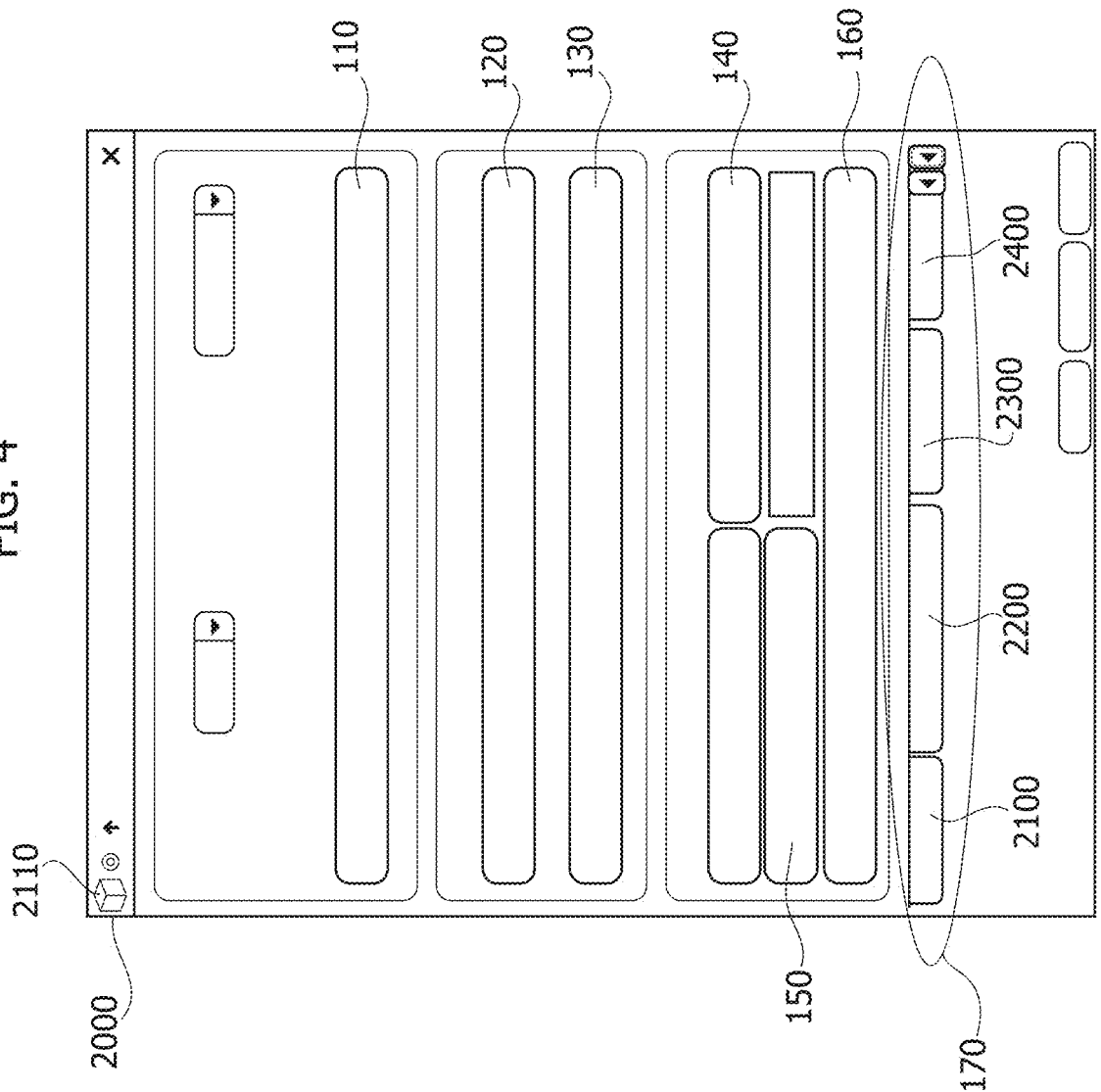
FIGS. 4 to 16 are schematic illustrations of interfaces of a system that implements an embodiment.

In FIG. 4 and the following figures, there aspects of an implementation of the method are described as software module that operates within a design and simulation tool operating on a computer. This software module is described via the representation of a fullscreen of a so-called form 2000, i.e., a form for gathering user inputs that comprises selection fields, softkeys and selection tabs. In what follows, it is understood that the selection softkeys and tools of the above form are configured for enabling execution of the operations described as associated thereto, in particular via scripts and subprograms, in various embodiments written in SKILL or C language so as to be compatible with the Cadence design environment. In particular, it is envisaged that the form 2000 represents a specific procedure of evaluation of the substrate of a chip or circuit for obtaining the netlist thereof, which, in one embodiment, is accessed, during drafting of the layout of the aforesaid electronic chip or circuit, by the Cadence design environment, Virtuoso Platform, which is run on a computer or workstation or via a terminal associated to a system of computers.

Figure 5:
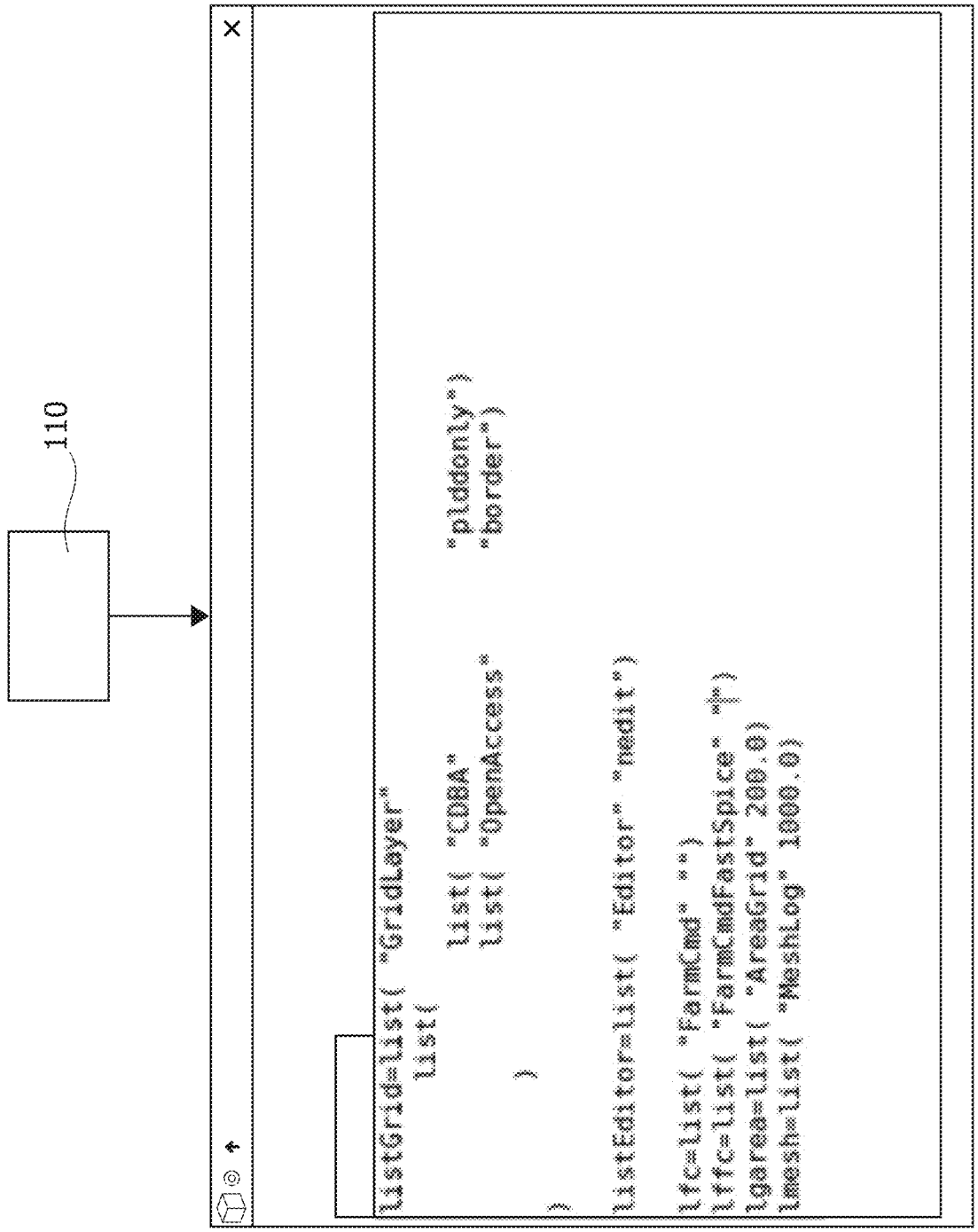

The aforesaid form 2000 comprises a selection area of the graphic user interface 170 comprising five selection tabs, 2100, 2200, 2300, 2400, and 2500. In FIG. 5, the tab 2500 is not visible even though it can be selected by scrolling the tabs laterally.

Selection of the tab 2100 enables access to operations regarding the step of generation of the layout 100 and to the step of generation of abstracts 200.

Selection of the tab 2200 enables access to operations regarding the step of generation of the grid 300 and of the netlist 400.

Selection of the tab 2300 enables access to the netlist-simulation environment 500 for carrying out analyses via simulation of the electronic circuit.

The tab 2400 regards the displayer 700 of the abstracts and of the schematics with cross references.

The tab 2500 regards the netlist DPI assisted simulation environment 600.

Hence, via selection of the tab 2100 it is possible to access a corresponding form 2110, i.e., a page of the form 2000, which is the one shown as selected in FIG. 4, where the following operations or functions comprised in the layout-generation step 100 can be selected:

setup 110
creation of an abstract 120
functions of merging, slicing, or naming of geometries 130
definition of regions and compacting of regions 140
search for geometries 150
separation of selected geometries 160

The setup function 110 comprises opening a file for setting up the configuration, for example, named setupuser.cfg, using a file editor, for defining parameters such as the grid layer, the preferred editor, the simulation queues of the computers provided (via SPICE commands such as 'bsub-q long'), and the global grid parameters. Illustrated in FIG. 5 is an example of the above setup file.

Figure 6:
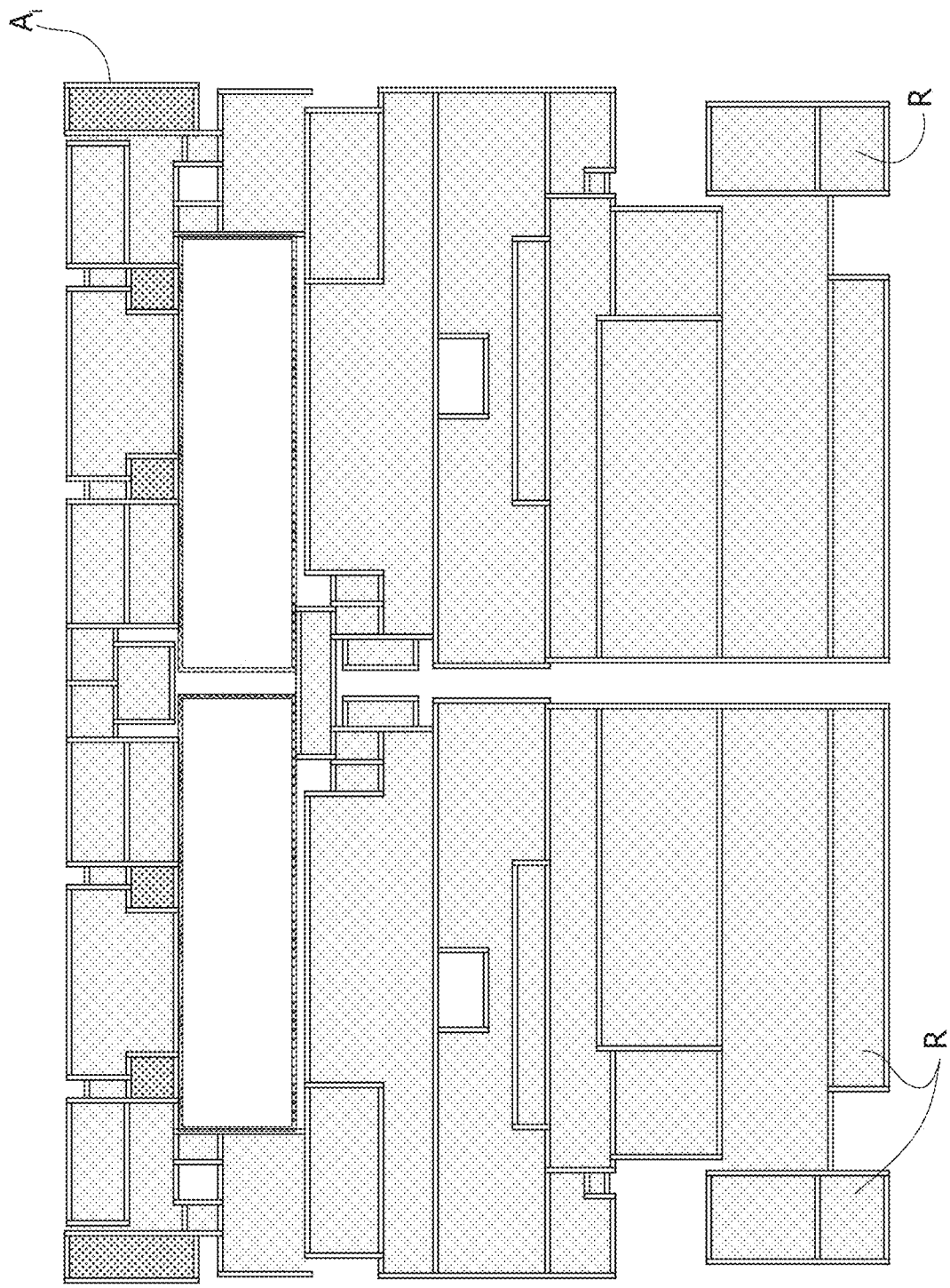
Figure 7:
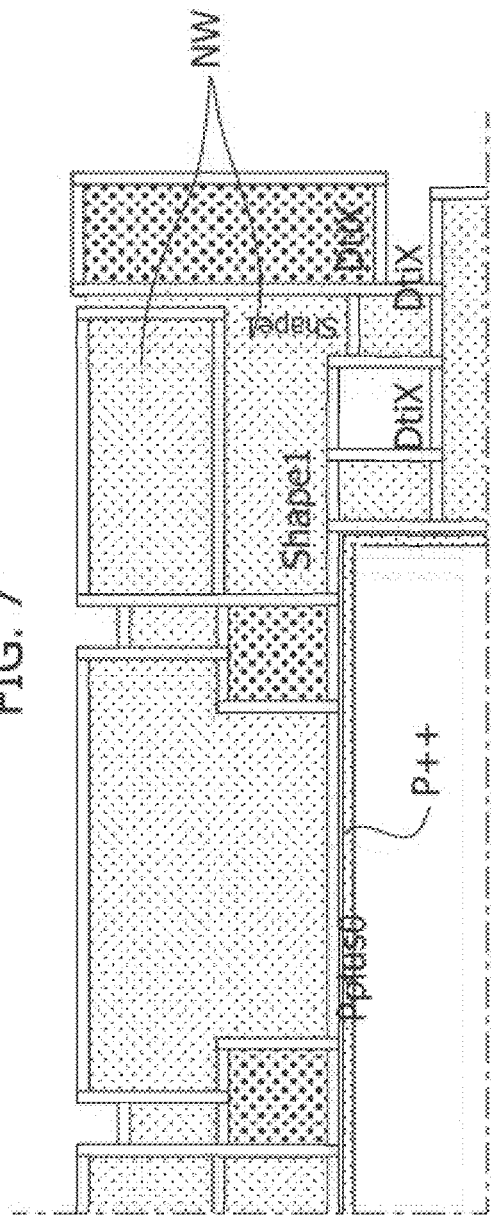

Via the step of abstract creation 120, or the action on the corresponding softkey, from the layout view L of a layer the abstract view A of the layout itself is generated. Illustrated in FIG. 6 is the abstract view $A_i$ of the i-th layer, as may be obtained, for example, through the Virtuoso Layout Suite, present in which are regions pertaining to n-wells, p++ doped layers, and deep-insulation trenches DTI, as illustrated more clearly in FIGS. 7 and 8. In other words, the step of abstract creation 120 corresponds to implementing the step 200 of abstract generation described previously. In particular, for example, in a way in itself known, display in layout mode L of a design suite such as the Cadence Virtuoso Layout Suite is opened, and an abstract subview A of the layout is generated.

On the aforesaid abstract view $A_i$ of the i-th layer, the functions of merging, slicing, and labeling of geometries 130 operate. These functions, given a layer displayed at the abstract level, as illustrated in FIG. 8, enable merging and subdivision of the geometries generated automatically in generating and assigning progressive names or labels to the geometries of the abstract view A. For example, as illustrated in FIG. 8, the geometries of an n-type well are designated with labels such as Shape0, ..., ShapeN. The geometries of a layer of a p++ type are designated with labels such as Pplus0, ..., PplusM. The geometries of a DTI type are designated by DtiX. The contiguous geometries preserve the same name or label (e.g., Shape1 in FIG. 8). In particular, the geometries of the insulations DtiX connect up to one another laterally and vertically. In FIG. 9, designated by Dti0 and Dti1 are connected insulations.

The function of definition of regions and compacting of regions 140 envisages operating on the original abstract view $A_i$ for modifying it or generating artificial regions. Definition of regions operates for preserving the maximum occupation of space by the geometries of the abstract $A_i$ comprised in the artificial region. Compacting of regions operates for preserving the overall area of the geometries comprised in the artificial region.

The geometry-search function 150 enables entry of a geometry label (e.g., Shape87), which is then highlighted in the abstract view $A_i$ or else selection of a geometry in the abstract view $A_i$ and viewing of the corresponding name displayed in a string field.

The separation of selected geometries 160 enables renaming in an incremental way of contiguous shapes or geometries, in particular of the same type.

Illustrated in FIG. 9 is the page 2210 of the form 2000 displayed via selection of the tab 2200, which enables execution of functions of the procedure of generation of the netlist 400 and of the grid 300. The following operations are indicated:

selection of the type of netlist 315;
functions of generation of the grid TG and of the database of the meshes of the grid 410;
local/global refinement, via functions of viewing and editing of the mesh 325;
definition of the thickness of the wafer 330;
mode of connection of the substrate 340;
creation of the netlist 350 and editing 360 thereof;

The operation of selection of the type of netlist 315 involves indicating in which of the following three modes it is desired to operate:

a first mode, which extracts only the resistances of the substrate in a distributed way;
a second mode, which extracts the resistances of the substrate in a distributed way and the values of the RC model associated to the n-well socket in a lumped way;
a third mode, where substrate resistances and values of the RC model of the n-well socket are extracted according to a three-dimensional finite-element analysis.

It is clear that in variant embodiments it is possible to operate directly adopting just one of the aforesaid three modes, i.e., without making the selection 315, or else selecting between two of the aforesaid three modes, or again choosing in a wider list that comprises one or more of the aforesaid three modes In what follows, reference will be made to a substrate SBS, such as the substrate layer, distinct from other structures that are diffused. Obtaining a netlist of the aforesaid substrate SBS is the first aim of the method, but, as illustrated hereinafter, the netlist at the substrate level obtained can be rendered more complex and precise taking into account other structures diffused in the substrate SBS and using different models of the components.

Hence, in the first mode a model of the substrate SBS is extracted, without taking into account the presence of n-wells or buried layers. In fact, in this mode a netlist NC of the substrate SBS is extracted that takes into account only the distributed resistances or conductances of the triangular elements Tk on the substrate SBS obtained through the process 300 of generation of the grid. In the second mode, also the presence of well structures is taken into account, such as sockets of n-wells and buried layers, in order to represent the respective RC models with concentrated parameters of resistance and capacitance. The RC model of the n-well socket, for example, takes into account the resistances and capacitances seen by the n-well towards the insulation and towards the buried layer, whereas the RC model of the buried layer BL takes into account the resistances and capacitances seen by the buried layer towards the insulator and towards the respective n-well. The third mode envisages finite-element analysis both of the distributed resistances or conductances of the triangular elements Tk and of the RC values associated to the wells, as well as their capacitances towards the bottom layer and their lateral capacitances.

Figure 10:
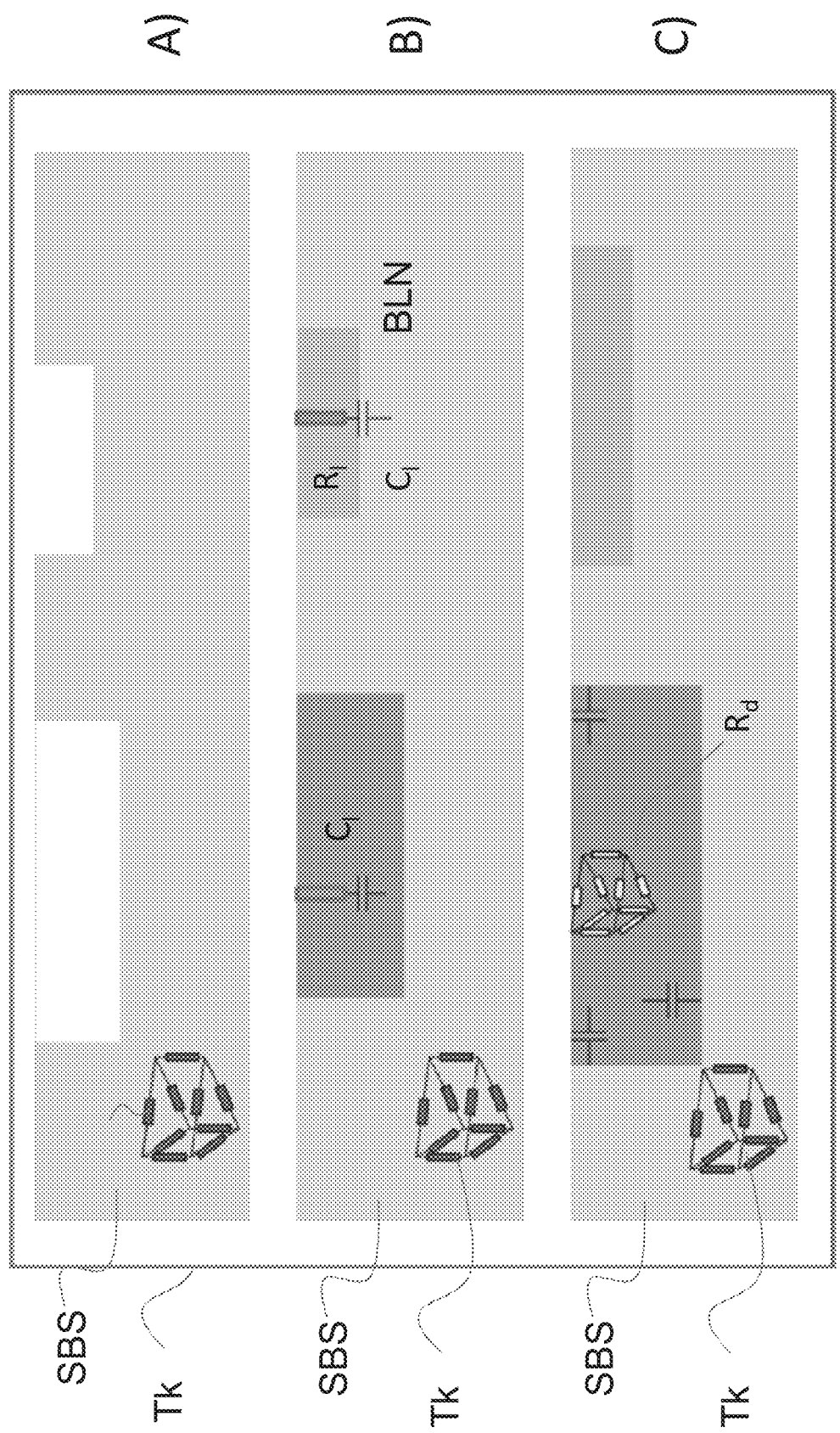
Figure 12:
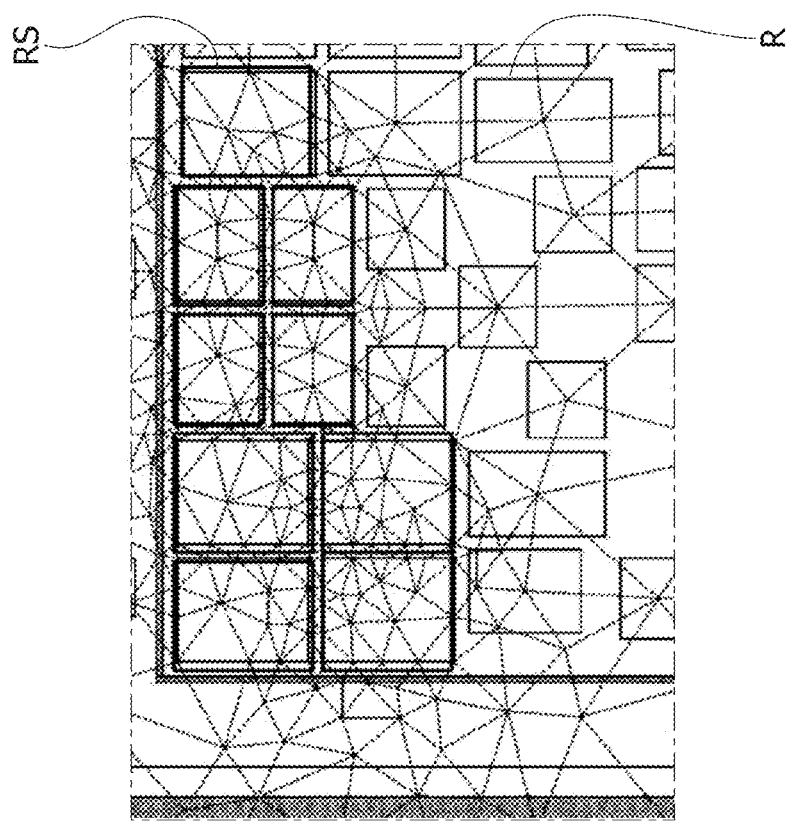

This is better exemplified in FIG. 10, which represents schematically in lateral section a substrate that comprises an n-well socket with buried layer BLS, whilst designated by BLN is an n-well socket without buried layer. In FIG. 10, the n-well socket, the buried layer designated by BLN is in fact represented as having a well deeper than the n-well socket BLN.

The capacitive interface of each well develops between the well BLN or BLS and the substrate. In the first extraction mode (FIG. 10A), neither capacitive interfaces nor the resistivity of the wells BLN or BLS are contemplated. In fact, in FIG. 10A the wells are represented empty, and that volume is not taken into account to obtain the substrate netlist. In this way, there is direct access to the substrate SBS, modeled through the triangular grid TG and through calculation of the distributed parameters of conductivity of each triangular element Tk towards each connected element, via finite-element analysis. In the second mode (FIG. 10B), both the interface capacitance and the well resistivity are described through a capacitance $C_1$ and a resistance $R_1$ according to a lumped or concentrated-parameter model. In the third mode (FIG. 10C), both the capacitance of the interfaces and the well resistivity are described via distributed-parameter values of capacitance $C_d$ and resistance $R_d$. The third mode thus envisages the finite-element analysis both of the distributed resistances and of the values of capacitance $C_d$ and resistance $R_d$ given, respectively, by the interface capacitances and the well resistivities.

The operations of local/global refinement 325 comprise indicating the quality of the mesh according to a trade-off between the resolution that it is desired to obtain and the number of mesh elements generated.

Figure 11:
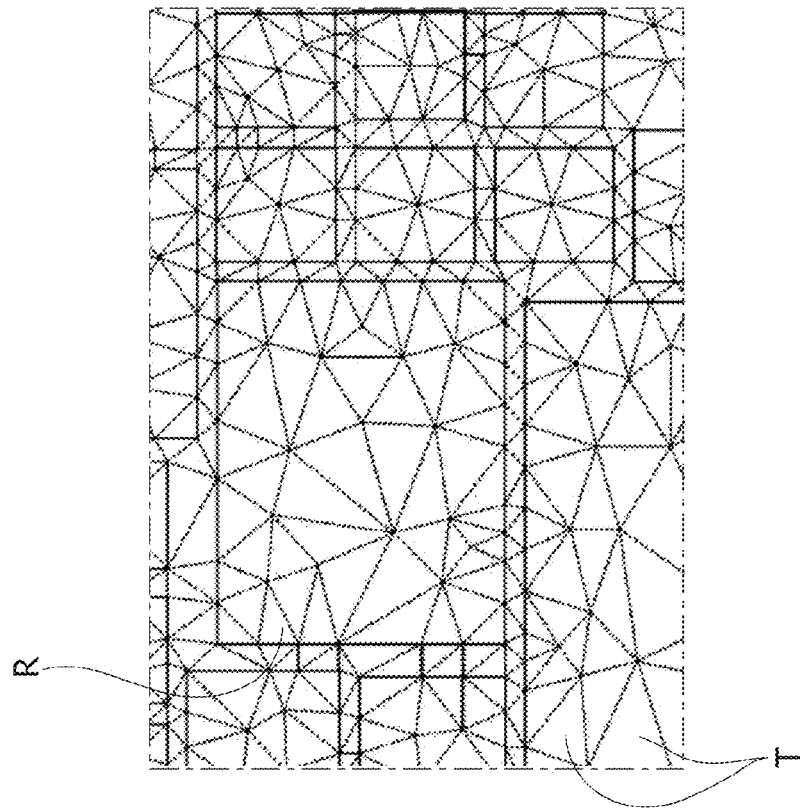

Moreover, according to one aspect of the method according to the invention, a step 345 is envisaged for setting boundary conditions for generation of the meshes, such as:

forcing the mesh triangles generated by Delaunay triangulation to respect the edges of the geometries, i.e., for example, remain inside them or outside them (greater precision, higher number of triangles); provided by way of example in FIG. 11 is a fullscreen of a grid TG thus obtained, where designated by R are the geometries, which are in any case square or rectangular in shape;

respecting the edges only for selected geometries; provided by way of example in 12 is a fullscreen of a grid TG thus obtained, where designated by R are the geometries, and designated by RS are the selected geometries, distinguished by a thicker edge; and respecting the edges for selected geometries, added to the ones previously selected, i.e., keeping track of the preceding grid database; in the latter mode, it is possible to obtain a final grid database in multiple steps.

Following upon these steps, meshes are created and displayed, creating the database of the meshes 410. On the basis of the complexity of the meshes an approximate estimate of the final layer netlist $NS_i$ is supplied.

The operations of definition of the thickness of the wafer 330 and of the mode of connection of the substrate 340 envisage that it is possible to indicate the thickness of the wafer. For the connection 340, it is possible to specify whether the bottom nodes of the mesh of the last layer (in FIG. 2, the bottom layer P++, for example) are to be indicated all as 'netsub' (see also the example of netlist hereinafter), or else all the aforesaid nodes are to be considered as independent nodes. It is likewise possible to access a user mode in which the contact regions are traced on a specific marker technology layer. Moreover, in the above latter user mode, it is possible to evaluate the contact region. The nodes of the bottom mesh within the marker layer are labeled, for example, as netSub0, netSub1, . . . , netSubn. They can hence be connected in a selective way. It is possible to carry out in this a way a simulation of partial connection of the substrate, for example, a delamination.

The operation of creation of the netlist of the layer 350 and its editing 360 envisage creating the file of the netlist in a given path, for example:

<$PWD>/SubDir/Netlist/director
    Netlist name: <cell_name>"_"<view_name>
i.e. (DSA_DIFF_TOP_sub_view)
Suffix name:
.sp for 'Substrate Only'
_RC.sp for 'Substrate+RC
_3D.sp for 'Finite Elements 3D
For editing of the netlist, it is displayed.

Figure 13:
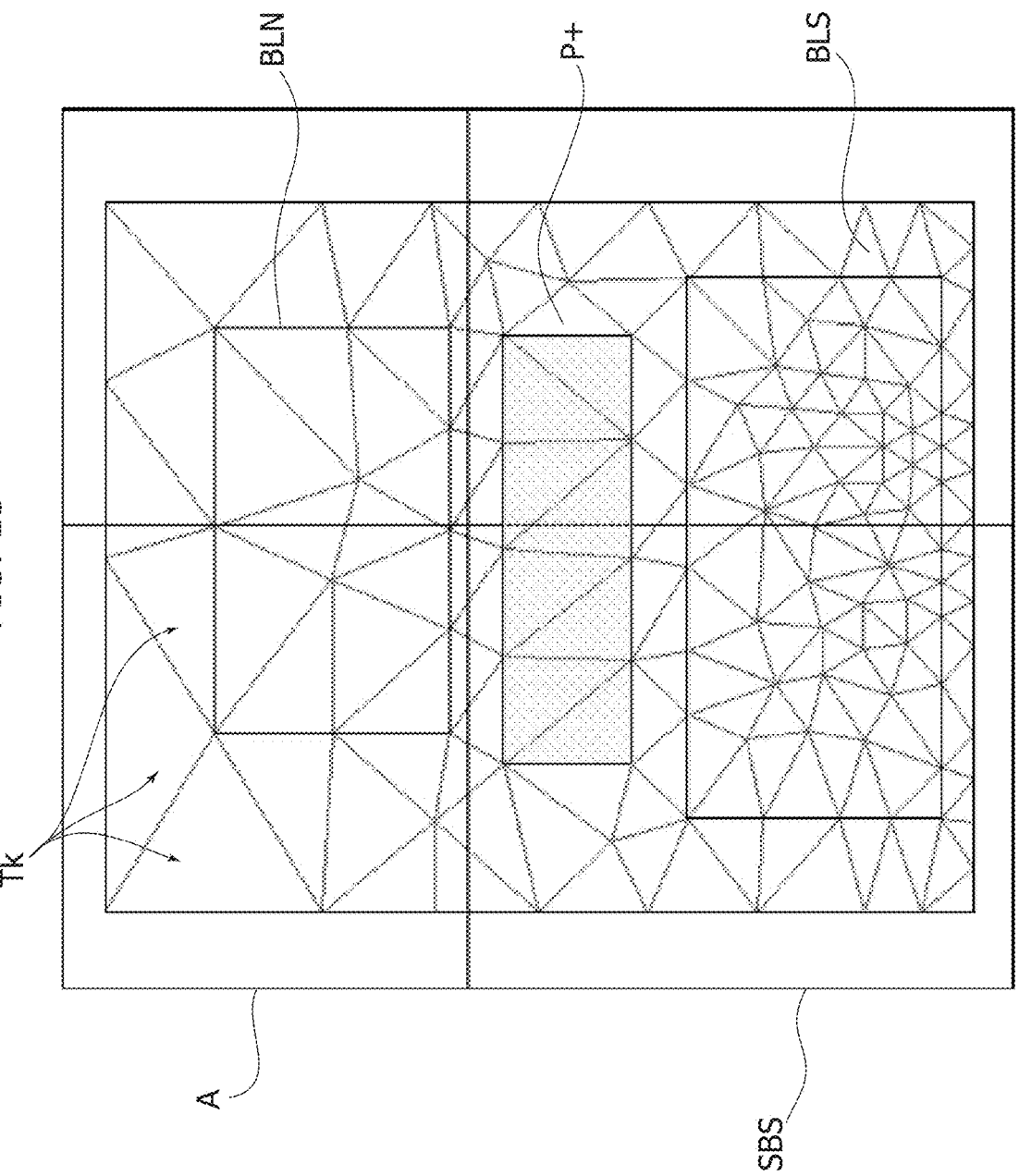

Illustrated by way of example in FIG. 13 is an abstract view A of a simple structure comprising an n-well geometry with buried layer, labeled NwellBL, an n-well geometry without buried layer, labeled Nwell, and a p+ region labeled PplusA.

Provided hereinafter is a partial example of file of netlist NC, as obtained via the method according to the invention. Indicated in the columns, according to the format of SPICE lists, are the name of the component, the nodes between which the component is connected, including the indication of the label of the region and the layer (10, 11, 12), and the value of capacitance or resistance obtained via a concentrated-parameter model or a distributed-parameter model. For reasons of space, provided sequentially by way of example are just some sets of rows of the netlist, skipping considerable sets of rows in the middle (e.g., capacitances C0, C1, . . . , C32, C33)

C0 10__8_p NwellBL 9.0675e−16
C1 10__9_p NwellBL 1.5755e−15
. . .
C32 10__104_p NwellBL 1.4712e−15
C33 10__117_p NwellBL 1.3375e−15
R0 10__0_p 11__0_p 1.4668e+05
R1 10__1_p 11__1_p 4.2953e+03
R2 10__2_p 11__2_p 7.2353e+03
R3 10__3_p 11__3_p 1.3903e+05
R4 PplusA 11__4_p 8.3167e+03
R5 PplusA 11__5_p 4.5352e+03
R6 PplusA 11__6_p 6.0869e+03
R7 PplusA 11__7_p 8.7271e+03
R8 10__8_p 11__8_p 2.5562e+04
. . .
R81 NwellBL 11__8_n 1.1853e+03
R82 NwellBL 11__9_n 2.6076e+02
R83 NwellBL 11__10_n 1.9936e+02
R84 NwellBL 11__11_n 9.0391e+02
R85 Nwell 11__12_n 2.6021e+02
R86 Nwell 11__13_n 7.4986e+01
. . .
R151 NwellBL 11__117_n 1.7685e+02
R154 10__9_p PplusA 3.7804e+03
R155 10__10_p PplusA 2.8430e+03
. . .
R59911__42_n12__42_n 1.0790e+02
R60011__44_n12__44_n 8.1499e+01
. . .
R644 11__116_n 12__116_n 6.7841e+01
R645 11__117_n 12__117_n 9.2698e+01
C34 11__8_p 11__8_n 2.0686e−15
C35 11__9_p 11__9_n 3.5941e−15
. . .
C66 11__104_p 11__104_n 3.3562e−15
C67 11__117_p 11__117_n 3.0511e−15
* P Type Resistor Lay 1
R646 11__5_p 11__4_p 2.8208e+04
R647 11__7_p 11__6_p 5.4064e+04
. . .
R835 11__117_p 11__9_p 2.8491e+04
R836 11__117_p 11__42_p 2.5141e+04
R837 11__117_p 11__21_p 2.0287e+04

```
*N Type Resistor Lay 1
R838 11__27_n 11__13_n 3.1075e+03
R839 11__27_n11__14_n 1.4946e+03
. . .
R1009 11__117_n 11__116_n 6.0053e+01
R1010 11__117_n11__115_n 1.8281e+02
* O Type Resistor Lay 1
* End Lay 1
Cv68 11__12_n11__12_p 1.6758e−15
Cv69 11__13_n11__13_p 5.8152e−15
. . .
Cv79 11__91_n11__91_p 1.3296e−14
R1011 12__0_p 13__0_p 9.9078e+04
R1012 12__1_p 13__1_p 2.9014e+03
. . .
R1127 12__116_p 13__116_p 9.2962e+03
R1128 12__117_p 13__117_p 7.0655e+03
C80 12__8_p 12__8_n 1.1618e−15
C81 12__9_p 12__9_n 2.0186e−15
. . .
C102 12__104_p 12__104_n 1.8850e−15
C103 12__117_p 12__117_n 1.7136e−15
* P Type Resistor Lay 2
R1129 12__5_p 12__4_p 1.6822e+03
R1130 12__7_p 12__6_p 3.2242e+03
. . .
R1445 12__117_p 12__42_p 8.9327e+02
R1446 12__117_p 12__21_p 1.2098e+03
* N Type Resistor Lay 2
R1447 12__34_n 12__30_n 2.1975e+02
R1448 12__34_n12__8_n 9.5610e+01
. . .
R1595 12__117_n 12__116_n 6.8197e+01
R1596 12__117_n 12__115_n 2.0760e+02
* O Type Resistor Lay 2
* End Lay 2
Cv104 12__8_n12__8_p 3.4759e−16
. . .
Cv161 12__116_n12__116_p 3.1830e−15
Cv162 12__117_n12__117_p 2.3295e−15
R1597 13__0_p netSub 3.3128e+04
R1598 13__1_p netSub 9.7012e+02
. . .
R1713 13__116_p netSub 3.1083e+03
R1714 13__117_p netSub 2.3624e+03
* P Type Resistor Lay 3
R2033 13__5_p 13__4_p 1.7374e+00
R2034 13__7_p 13__6_p 3.3299e+00
. . .
R2349 13__117_p 13__42_p 9.0404e−01
R2350 13__117_p 13__21_p 1.2495e+00
* N Type Resistor Lay 3
* O Type Resistor Lay 3
* End Lay 3
```

Figure 14:
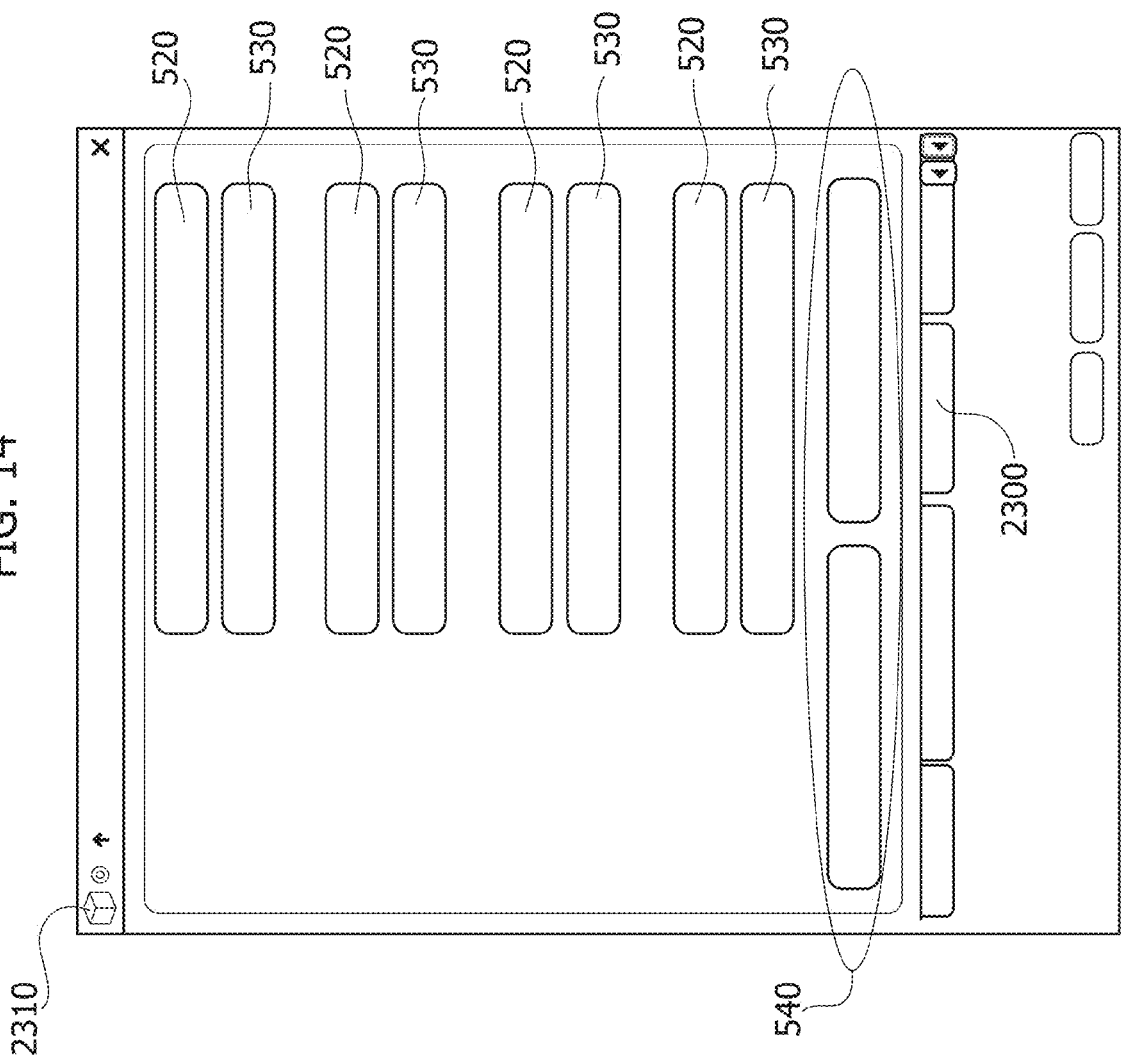

The netlist-simulation environment 500 comprises a procedure of analysis, accessible through the selection of the corresponding tab 2300 in the main screen and represented by the form 2310 of FIG. 14, which envisages the following steps:

choice of the types of simulator 520;
setup of simulation of the netlist 530; and
launching 540 of the environment for display of the waveforms (for example, Ezwave viewer or Cadence Browser).

The choice of the types of simulator enables a multiple simulation of the flat netlist NC of a SPICE type by choosing, for example, from among ELDO, Spectre, HSIM, UltraSIM. As illustrated in FIG. 14, the aforesaid choice is set via the action on respective selection softkeys 520, which enable execution of the chosen simulation. It is then envisaged that by pressing a further editing softkey regarding a given simulation, a template is shown of a simulation file specific and pre-defined for each different simulator. The aforesaid file templates are stored in the directory of the technology file and can be customized by the user.

The inclusion of the substrate netlist depends upon the type of file of the netlist to be analyzed and is modified manually.
<netlist_name>.sp for 'Substrate Only'
<netlist_name>_RC.sp for 'Substrate+RC'
<netlist_name>_3D.sp for 'Finite Elements 3D'.

Provided hereinafter is an example of file for Spectre simulator. Conventionally attributed to the file is the default name <cell_name>_<cell_view>.scs in the Spectre simulation directory <$PWD>/Subdir/Sim/Spectre/

```
// From Template
Simulator lang=spectre in sensitive=yes
Global 0
Parameters inf=1.0e10
V0 (shape0 0) vsource type=pwl wave=[0 0 10n 1]
Rterm (shape1 0) resistor r=1e-6
Ic
//0p dc force=all
TranAnalysis tran stop=12n skipdc=yes ic=all method=gear 2
errpreset=liberal
    save shape0 shape1
    save V=:currents
    include
"/home/guest624/WORK/UM14BC__01__FEB11/UM14BC/SubDir/Netlist/DriverCC__subview.sp"
``` and an example of file for ELDO simulator:

```
* From Template
V1 shape 1 0 pwl (0 0 10e-9 1)
Rout shape2 0 1e-6
.global 0
*.op
*.dc
```

```
.param inf=1.0e9
.ic
.tran 10n 10n uic
.probe tran i(V1)
.extract tran label=Res −1.0/min(i(v1))
*.extract dc label=I_aggressor −i(v1)
.include
"/home/guest624/WORK/UM14BC_01_FEB11/UM14BC/SubDir/Netlist/DriverCC_subvi
ew.sp"
```

In the framework of the analysis procedure there is then performed the simulation, in particular operating on the corresponding selection softkeys 520 illustrated in FIG. 14. These launch the corresponding simulation on a computer, where, for example, the Cadence application Virtuoso/icfb is being run or else on the command queue of a farm of server computers when this has been specified in the setup file.

The softkeys 540 launch, instead, the environment Ezwave viewer or Cadence Browser for display of the waveforms.

Figure 15:
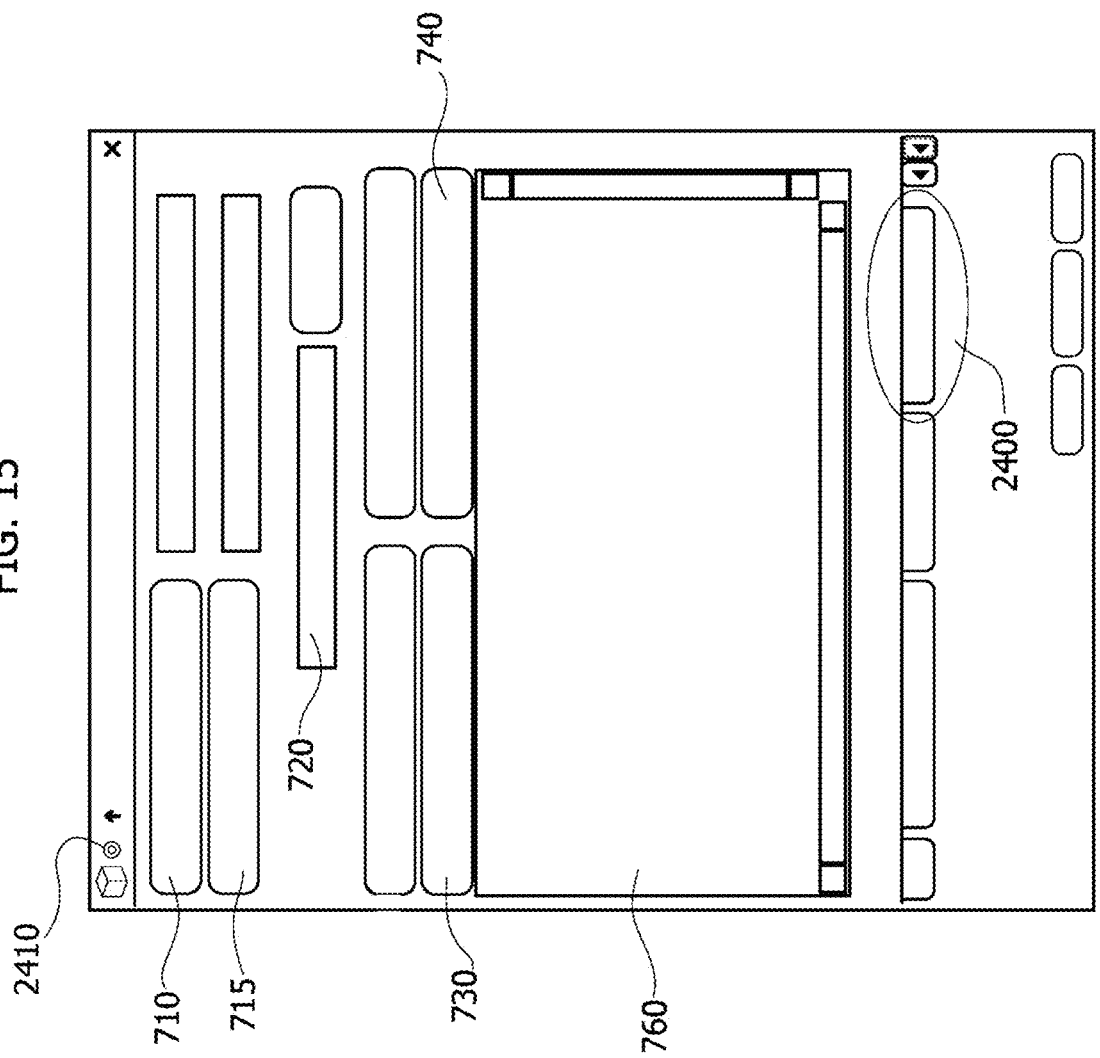

Designated by 2410 in FIG. 15 is the display of the form associated to the cross-reference procedure 700, which represents an assistant display with graphic user interface (GUI) between a schematic instance and the respective n-well sockets in the layout subview.

The aforesaid form 2410 is configured for enabling, once both of the views have been opened on the screen, namely, schematic S and layout subview L, selection of these views represented on the screen (in the form 2410 via respective softkeys for setting the schematic view 710 and the layout subview 715). The form 2410 is configured for thus enabling setting of a cross reference, via the operations of highlighting the corresponding socket in the layout view L, following upon a selection of a component on the schematic view S, which generates a selection of the corresponding socket in the layout view L. The aforesaid setting is obtained via a script associated to a corresponding softkey 730 for creation of the cross reference. The action generates the definition of the connection between the terminal Sub and the name of the shape, for example, with Eldo and Spectre syntax in a window, whilst a softkey 740 is configured for saving the aforesaid definition of connection in a dedicated transcript. The form 2410 is configured via a script associated to a softkey 770 for selecting all the instances with Sub connections, i.e., the components within the schematic visible in the schematic view with Sub terminals. The action on the softkey 730 of creation of the cross reference generates in this case highlighting of the set of corresponding elements in the subview and the formation of the corresponding connections in text form in the window 760.

The form 2410 is also configured (softkey 720) for enabling selection of an ixf file, i.e., an output text file that contains topological information between a schematic instance and the corresponding physical layout database, which is then verified, for example, with the tool Calibre.

Figure 16:
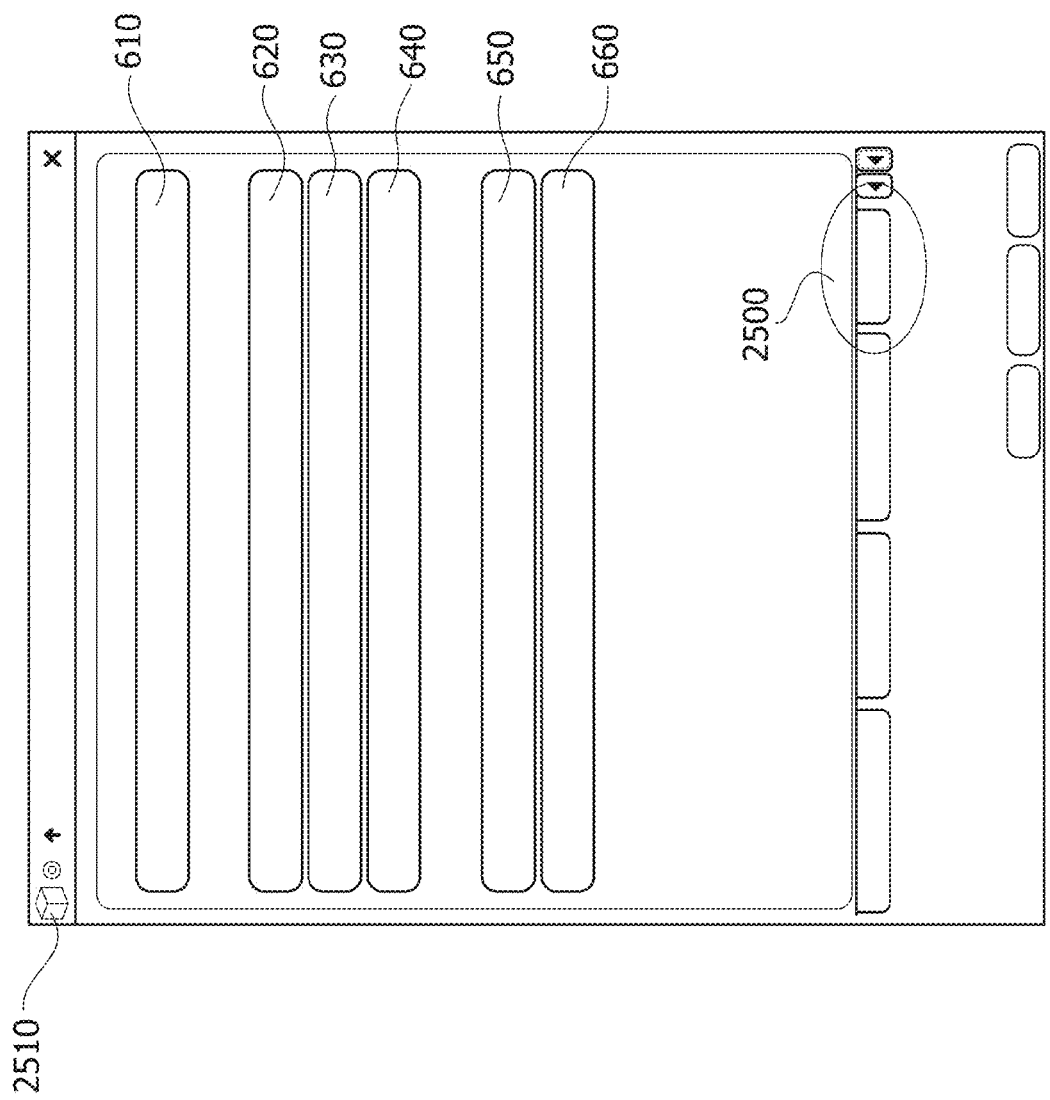

Designated by 2510 in FIG. 16 is the display of a form regarding the assisted simulation DPI (Direct Power Injection) environment 600. The availability of the aforesaid environment 600 is advantageous when it is necessary to carry out simulation of injection of a disturbance in the system (at the level of PCB, i.e., printed circuit board, of package, and at of silicon). The level of power injected (in dBmW) by a disturbance can reach high values such as to cause the forward biasing of the p-n junctions (ESD protections and terminals of the n sockets). Under conditions of forward biasing, the a.c. electrical simulations are not feasible, whereas carrying out multiple simulations in transient regime, by filtering and processing the results, can cause a considerable increase of resources to be dedicated to the above verification. Consequently, making available DPI analysis in the framework of evaluation of the substrate has the purpose of creating an automatic process for the entire simulation flow through a simple graphic user interface.

Via the environment 600 and the operations configured in the corresponding form 2510 it is possible to obtain a Bode diagram of an output signal under observation in the desired frequency range. The Bode diagram is obtained as collection of simulations in transient regime performed at different sample frequencies. At each sample frequency, the signal is filtered in a neighborhood of the aforesaid frequency and processed via FFT.

For simulation the following are required:
model of the package;
model of the printed circuit or board;
ESD protection loop;
all the circuits involved;
substrate netlist NC.

All the simulations are performed with the Spectre simulator for processing a database of waveforms within the Cadence environment.

As prerequisites, there must be created a netlist of the system outside the procedure of creation of the netlist of the substrate, for example, in the repository created via the software tool Analog Artist.

Represented in the form 2510 is a softkey 610 that enables opening and setup of three files: FindPowerinclude.il, SetUpFindPower, SetUpSimulate. The file FindPowerinclude.il defines the frequency range, which is a list of frequency values, setting of the environment variables (SimRepm, Design Sim), and setting of the calibration (PowerDbm, InitialVoltageGuess, CreateLogFile, Logfile, OutFile).

The file SetUpFindPower defines a simulation set for establishing, frequency by frequency, the value of the sinusoidal input wave so as to guarantee the desired level of power in dBm, the input on which to apply the disturbance, the output on which to observe the effect, the inclusion and organization in instances of the netlist of the package, the resistance of the dissipators/glues.

The file SetUpSimulate is the main simulation file of the netlists for generation of the Bode diagram. It includes:
the SPICE netlist of the model of the package;
the netlist of the substrate;
the netlist of the board;
data files of the calibrated input voltage; and
the resistance of the dissipator.

In the form 2510, via the calibration-execution softkey 620 a set of calibration simulations is carried out for establishing the correct level of input voltage with respect to the superimposed power in dBm.

Via the softkey 630 for execution of the simulation of the frequency spectrum, with reference to a calibration file generated by the operation 620, a complete set of simulation steps at the sample frequencies is carried out.

In the form 2510, there is implemented, via the softkey 640, an operation of analysis of the frequency data, which creates a file that contains the pairs of frequency values, dBuV, i.e., the values of the Bode diagram.

In the form 2510, there is hence implemented, via the softkeys 650 and 660, execution of applications such as GNUPLOT and Ezwave, which create a diagram on the basis of the file that contains the pairs of frequency values, dBuV.

Hence, the method and system according to the invention enable extraction of an electrical netlist of the substrate, useful for evaluating the interaction at the substrate level between devices in a chip.

Using the method and system according to the invention, it is advantageously possible to extract the substrate netlist for the entire chip, providing, for example, a SPICE-compatible flat netlist with different simulators (Eldo, Spectre and other simulators), and fast simulators.

Advantageously, as compared, for example, to a method of generation of the orthogonal grid, the method using the Delaunay triangulation increases the precision while reducing the number of elements. In fact, for its characteristic of maximizing the minimum angles of the triangles, this type of triangulation tends to produce equiangular triangles, rendering the grids uniform.

The method and system according to the invention, operating at the substrate level, enable implementation of additional functions, such as automation of connections between the circuits and the substrate netlist, a multi-simulator environment, and a function of Direct Power Injection to simulate disturbances taking into account also the substrate.

Of course, without prejudice to the principle of the invention, the details of construction and the embodiments may vary, even significantly, with respect to what has been illustrated herein purely by way of non-limiting example, without thereby departing from the sphere of protection. The aforesaid field of protection is defined by the annexed claims.

The method for automatic design of an electronic circuit according to the invention can of course be comprised in the process of production of the corresponding electronic circuit, which integrates the operations of design with operations of manufacture of the integrated circuit, for example, in the context of the so-called "silicon factory", i.e., the plant or the part of the production line that carries out the above manufacturing operations.

What is claimed is:

1. A method for automatic design of an electronic circuit, comprising using a computer for performing steps of:
   generating a layout of said electronic circuit;
   generating abstract data at the substrate level associated to the layout of said electronic circuit;
   generating a grid of subdivision into meshes and nodes with respect to a view pertaining to said abstract data and applying it to a substrate;
   extracting, on the basis of said subdivision grid, a full electrical netlist pertaining to the substrate;
   performing an evaluation of the interactions between devices of said electronic circuit at the substrate level according to said full electrical netlist pertaining to the substrate;
   subdividing the devices of the electronic circuit according to a plurality of layers;
   applying said subdivision grid to each layer;
   for each layer, analyzing grid elements obtained from the subdivision operation; and
   calculating electrical parameters to be associated to said grid element according to a technology-configuration file pertaining to the analyzed grid element.

2. The method according to claim 1, wherein said full electrical netlist pertaining to the substrate is supplied as a netlist of a flat type for an instance-based simulator, and said evaluation is made through one or more simulators configured for processing said netlist.

3. The method according to claim 1, wherein the netlist is a flat SPICE netlist.

4. The method according to claim 1, wherein the set of the devices of the electronic circuit is subdivided according to a plurality of vertical layers; further comprising separating each of said layers into different regions on the basis of the technological parameters that identify each region in a layer; and wherein said subdivision grid is applied to each region of each layer.

5. The method according to claim 4, wherein applying said subdivision grid comprises applying a Delaunay triangular grid.

6. The method according to claim 4, further comprising: on the basis of said electrical parameters of the grid elements building a representation of the layer as a sparse matrix of said electrical parameters; converting said sparse matrix into a netlist of the layer; and building a full netlist according to the set of the netlists corresponding to each layer.

7. The method according to claim 6, further comprising extracting said electrical parameters to be associated to said grid elements, in particular to branches of triangular grid elements, as distributed resistances of the substrate.

8. The method according to claim 7, further comprising selecting a mode of operation of extraction from among:
   a first mode, which comprises extracting said electrical parameters to be associated to said grid elements, in particular to branches of triangular grid elements, as distributed resistances of the substrate, in particular via finite-element analysis;
   a second mode, which extracts the resistances to be associated to the grid elements of the substrate in a distributed way and extracts values of resistance and capacitance associated to the presence of well structures in a lumped way;
   a third mode, which extracts both the resistances to be associated to the grid elements of the substrate and values of resistance and capacitance associated to the presence of well structures via finite-element analysis.

9. The method according to claim 8, further comprising setting boundary conditions for generation of the meshes of the grid that can be selected as one or more of the following:
   forcing the mesh triangles generated by the Delaunay triangulation to respect the edges of the regions or geometries;
   respecting the edges only for selected regions or geometries;
   respecting the edges for selected regions or geometries, added to previously selected regions or geometries.

10. The method according to claim 1, further comprising automating the connections between said substrate netlist and the respective electronic circuits.

11. The method according to claim 1, wherein the computer is used to perform the steps in a multi-simulator environment.

12. The method according to claim 11, wherein said environment comprises a multiplicity of simulators chosen in a list that comprises ELDO, Spectre, HSIM, UltraSIM, and wherein the computer performs the steps using at least two simulators from the list.

13. The method according claim 1, further comprising supplying said netlist for an analysis of injection of disturbance into the system.

14. The method according to claim 13, wherein the injection of disturbance is Direct Power Injection.

15. The method according to claim 13, further comprising adding said netlist to a collection of netlists used for simulation in order to generate a Bode diagram in the framework of the analysis of injection of disturbance into the system.

16. A method for automatic design of an electronic circuit, comprising using a computer for performing steps of:
generating a layout of said electronic circuit;
generating abstract data at the substrate level associated to the layout of said electronic circuit;
generating a grid of subdivision into meshes and nodes with respect to a view pertaining to said abstract data and applying it to a substrate;
extracting, on the basis of said subdivision grid, a full electrical netlist pertaining to the substrate;
performing an evaluation of the interactions between devices of said electronic circuit at the substrate level according to said full electrical netlist pertaining to the substrate;
subdividing the devices of the electronic circuit according to a plurality of vertical layers;
separating each of said layers into different regions based upon technological parameters that identify each region in a layer;
applying said subdivision grid to each region of each layer;
analyzing grid elements obtained from the subdivision operation for each layer;
calculating electrical parameters to be associated to said grid element according to a technology-configuration file pertaining to the analyzed grid element;
building a representation of the layer as a sparse matrix of said electrical parameters based upon said electrical parameters of the grid elements;
converting said sparse matrix into a netlist of the layer; and
building a full netlist according to a set of the netlists corresponding to the netlist of each layer.

17. The method according to claim 16, further comprising extracting said electrical parameters to be associated to said grid elements as distributed resistances of the substrate.

18. The method according to claim 17, further comprising selecting a mode of operation of extraction from among:
a first mode, which comprises extracting said electrical parameters to be associated to said grid elements as distributed resistances of the substrate, via finite-element analysis;
a second mode, which extracts the resistances to be associated to the grid elements of the substrate in a distributed way and extracts values of resistance and capacitance associated to the presence of well structures in a lumped way;
a third mode, which extracts both the resistances to be associated to the grid elements of the substrate and values of resistance and capacitance associated to the presence of well structures via finite-element analysis.

19. The method according to claim 18, further comprising setting boundary conditions for generation of the meshes of the grid that can be selected as one or more of the following:
forcing the mesh triangles generated by the Delaunay triangulation to respect the edges of the regions or geometries;
respecting the edges only for selected regions or geometries;
respecting the edges for selected regions or geometries, added to previously selected regions or geometries.

20. A method for automatic design of an electronic circuit, comprising using a computer for performing steps of:
generating abstract data at a substrate level of said electronic circuit;
generating a subdivision grid based upon said abstract data and applying it to a substrate;
subdividing the devices of the electronic circuit according to a plurality of vertical layers;
separating each of said layers into different regions;
applying said subdivision grid to each region of each layer;
analyzing grid elements obtained from the subdivision operation for each layer;
calculating electrical parameters to be associated to each analyzed element according to a technology-configuration file;
building a representation of the layer as a sparse matrix of said electrical parameters based upon said electrical parameters of the grid elements;
converting said sparse matrix into a netlist of the layer; and
building a full netlist according to a set of the netlists corresponding to the netlist of each layer.

21. The method according to claim 20, further comprising selecting a mode of operation of extraction from among:
a first mode, which comprises extracting said electrical parameters to be associated to said grid elements as distributed resistances of the substrate, via finite-element analysis;
a second mode, which extracts the resistances to be associated to the grid elements of the substrate in a distributed way and extracts values of resistance and capacitance associated to the presence of well structures in a lumped way; and
a third mode, which extracts both the resistances to be associated to the grid elements of the substrate and values of resistance and capacitance associated to the presence of well structures via finite-element analysis.

* * * * *